(12) United States Patent
Su et al.

(10) Patent No.: US 10,133,126 B1
(45) Date of Patent: Nov. 20, 2018

(54) CHIP PACKAGE HAVING A FLEXIBLE SUBSTRATE

(71) Applicant: CHIPBOND TECHNOLOGY CORPORATION, Hsinchu (TW)

(72) Inventors: Chun-Yang Su, Hsinchu (TW);
Jhao-Shin Wang, Hsinchu (TW);
Nian-Cih Yang, Hsinchu County (TW);
Xin-Wei Lo, Pingtung County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 15/841,424

(22) Filed: Dec. 14, 2017

(30) Foreign Application Priority Data

Sep. 28, 2017 (TW) .............................. 106133279 A

(51) Int. Cl.
| | |
|---|---|
| *H01L 23/495* | (2006.01) |
| *G02F 1/1339* | (2006.01) |
| *H01L 23/00* | (2006.01) |
| *H01L 23/31* | (2006.01) |
| *H01L 23/367* | (2006.01) |
| *H01L 23/498* | (2006.01) |

(52) U.S. Cl.
CPC ...... *G02F 1/13394* (2013.01); *H01L 23/3185* (2013.01); *H01L 23/367* (2013.01); *H01L 23/4985* (2013.01); *H01L 23/562* (2013.01); *H01L 24/16* (2013.01); *G02F 2201/50* (2013.01); *H01L 2224/16227* (2013.01)

(58) Field of Classification Search
CPC ... H01L 24/16; H01L 23/367; H01L 23/3185; H01L 23/4985; H01L 23/562

USPC ......................................................... 257/668
See application file for complete search history.

(56) References Cited

U.S. PATENT DOCUMENTS

| | | | |
|---|---|---|---|
| 5,669,775 A | 9/1997 | Campbell et al. | |
| 6,388,888 B1 * | 5/2002 | Seko | H01L 23/4985 174/259 |
| 9,111,912 B2 * | 8/2015 | Lin | H01L 24/97 |
| 9,198,282 B2 * | 11/2015 | Becker | H05K 1/0281 |

FOREIGN PATENT DOCUMENTS

| | | |
|---|---|---|
| JP | 11-163475 A | 6/1999 |
| JP | 2011-176112 A | 9/2011 |

OTHER PUBLICATIONS

Japanese Office Action dated Sep. 6, 2018 for Japanese Patent Application No. 2017-232519, 5 pages.

\* cited by examiner

*Primary Examiner* — Luan C Thai
(74) *Attorney, Agent, or Firm* — Jackson IPG PLLC; Demian K. Jackson

(57) ABSTRACT

A chip package includes a flexible substrate, a chip, a pressure-proof member and a reinforcement sheet. The chip and the pressure-proof member are located on a first surface of the flexible substrate, and the reinforcement sheet is located on a second surface of the flexible substrate. The pressure-proof member at least includes a pair of pressure-proof ribs which are located outside of the chip oppositely. The pressure-proof ribs located outside the chip can protect the chip from the damage caused by the pressure of other component (e.g. curved panel) except the chip package.

7 Claims, 4 Drawing Sheets

CHIP PACKAGE HAVING A FLEXIBLE SUBSTRATE

FIELD OF THE INVENTION

This invention relates to a chip package which can prevent a chip disposed on a flexible substrate from damage caused by other component (e.g. curved panel) except the components of the chip package.

BACKGROUND OF THE INVENTION

Electronic products currently tend to be light, thin and flexible, such as TV or smartphone having curved screen. The screen of the electronic product is a curved panel so that the electronic component in the electronic product may be damaged by the pressure of the curved panel.

With reference to FIG. 5, a liquid crystal display (LCD) screen 10 of an electronic product includes a curved panel 11 and a chip 13 disposed on a circuit substrate 12. The curved panel 11 may damage the chip 13 because of the pressure applied on the chip 13. As a result, the damaged chip 13 may be unable to electrically connect with the circuit substrate 12 and may increase the defect rate or the damage rate of the electronic product.

SUMMARY

The object of the present invention is to dispose a pressure-proof member and a reinforcement sheet on different surfaces of a flexible substrate respectively, and the pressure-proof member is adapted to protect a chip disposed on the flexible substrate from damage because of pressure.

The chip package of the present invention includes a flexible substrate, a chip, a reinforcement sheet and a pressure-proof member. The flexible substrate includes a first surface and a second surface. The chip is disposed on the first surface of the flexible substrate and includes a back surface and an active surface. The active surface faces toward the first surface and is electrically connected to the flexible substrate. A first height exists between the back surface of the chip and the first surface of the flexible substrate. The reinforcement sheet is connected to the second surface of the flexible substrate. A reinforcement region on the first surface of the flexible substrate is defined by a profile of the reinforcement sheet, and the chip is located within the reinforcement region. The pressure-proof member is disposed on the first surface of the flexible substrate and at least includes a pair of pressure-proof ribs which are located outside of the chip oppositely. Each of the pressure-proof ribs includes a revealed surface and a connective surface opposite the revealed surface, and the connective surface faces toward the first surface of the flexible substrate. A second height exists between the revealed surface of the pressure-proof rib and the first surface of the flexible substrate, and the second height is higher than or equal to the first height.

When the chip package is mounted in an electronic product having a curved panel (e.g. liquid crystal display), the pressure-proof member can contact with the curved panel to protect the chip from damage caused by the pressure of the curved panel because the pressure-proof member disposed on the first surface is taller in height than the chip disposed on the first surface.

Otherwise, the pressure-proof ribs located within the reinforcement region can increase the pressure and beaning resistances of the chip package, and the chip is protected from damage caused by the pressure of the curved panel because the pressure-proof member pressed by the curved panel will not deform or bend.

DETAILED DESCRIPTION OF THE INVENTION

Figure 1:
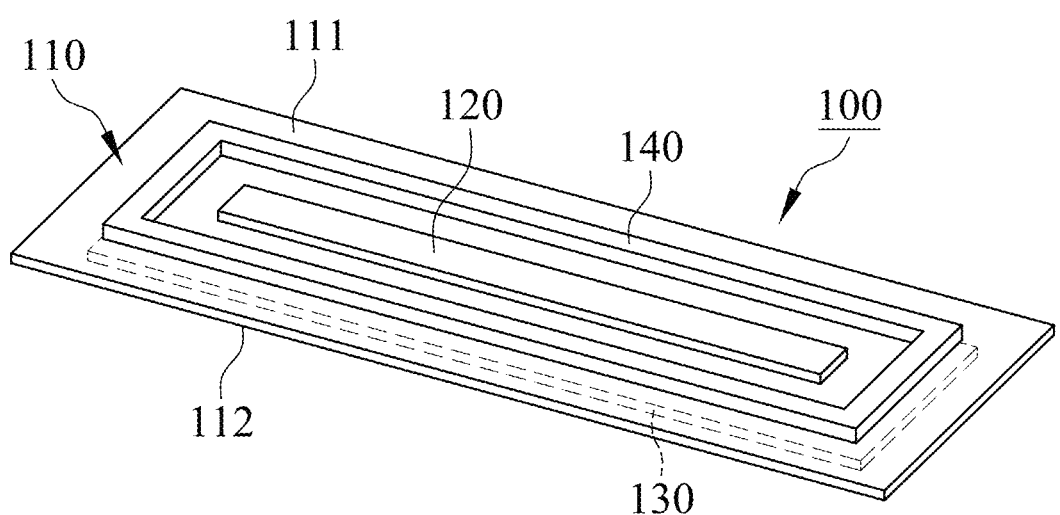
FIG. 1 is perspective assembly diagram illustrating a chip package in accordance with one embodiment of the present invention.
Figure 2:
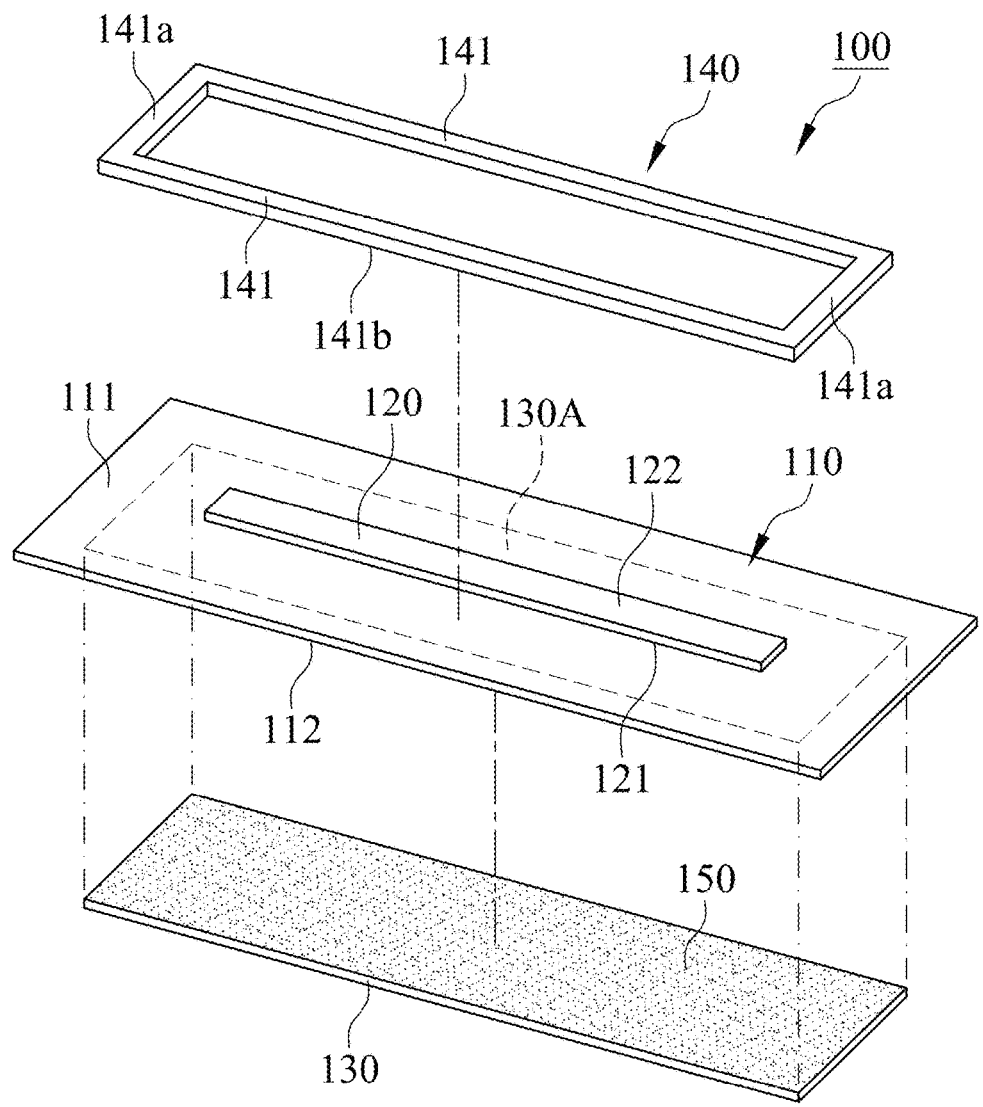
FIG. 2 is a perspective exploded diagram illustrating the chip package in accordance with one embodiment of the present invention.

With reference to FIGS. 1 and 2, a chip package 100 of the present invention includes a flexible substrate 110, a chip 120, a reinforcement sheet 130 and a pressure-proof member 140. The reinforcement sheet 130 and the pressure-proof member 140 are disposed on different surfaces of the flexible substrate 110, respectively. The flexible substrate 110 can be a substrate applied to a tape carrier package (TCP) or chip on film (COF).

Figure 3:
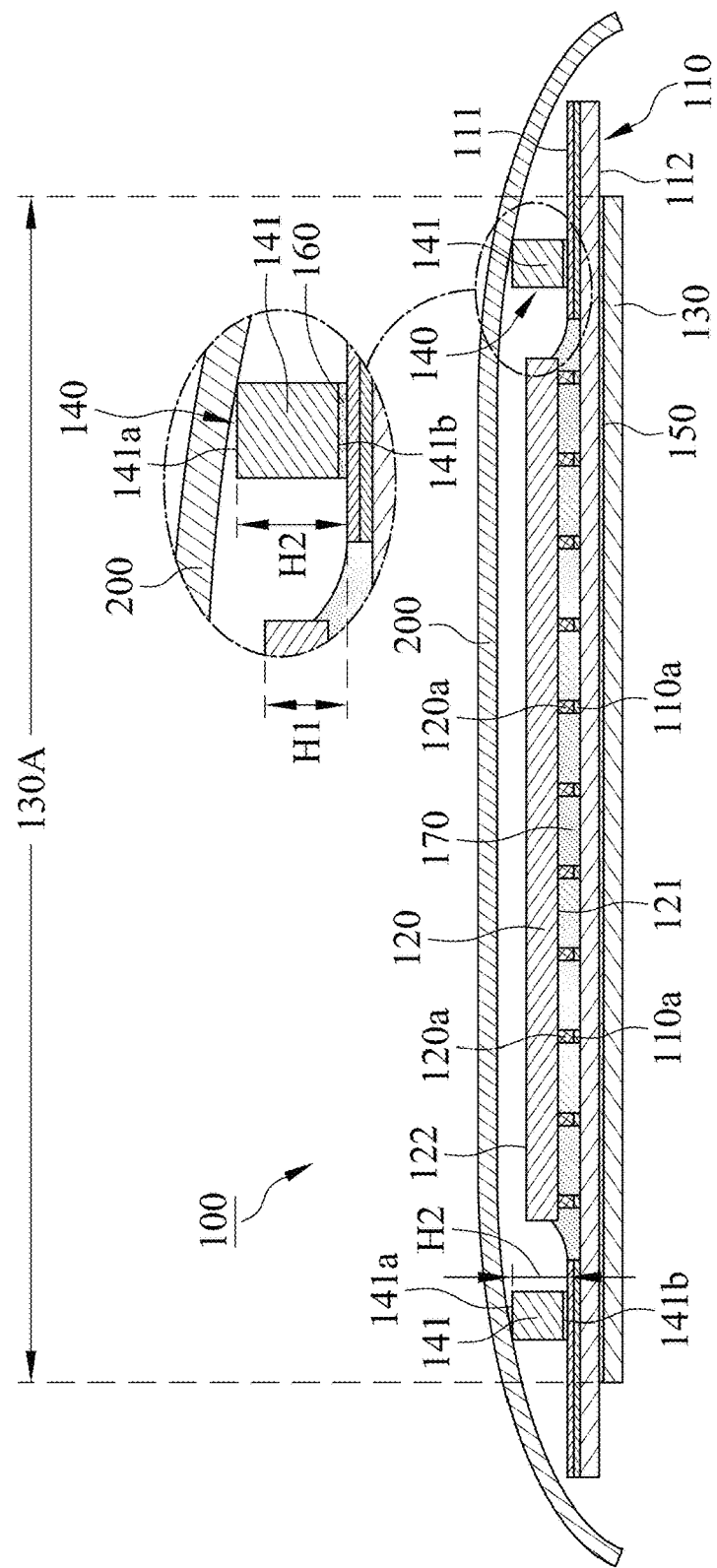
FIG. 3 is a cross-section view diagram illustrating the chip package in accordance with one embodiment of the present invention.
Figure 4:
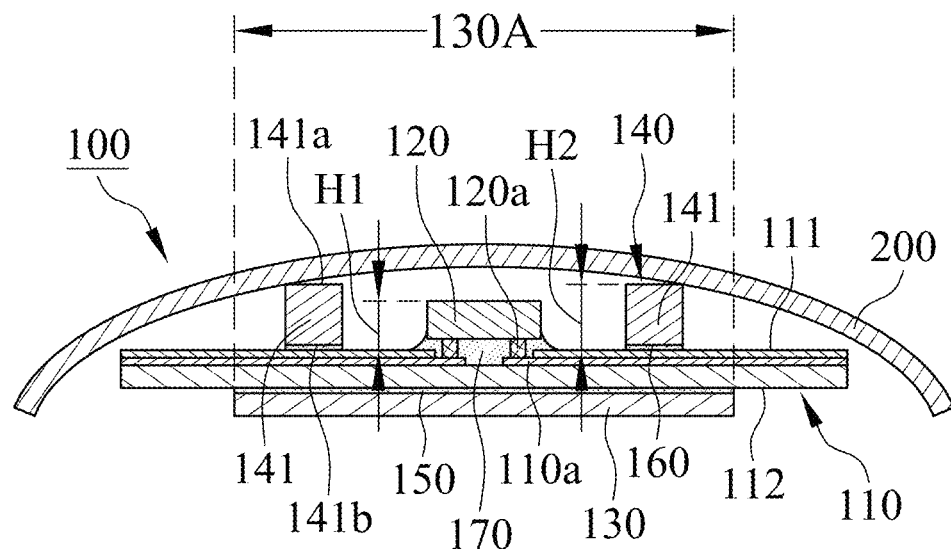
FIG. 4 is a cross-section view diagram illustrating the chip package in accordance with one embodiment of the present invention.
Figure 5:
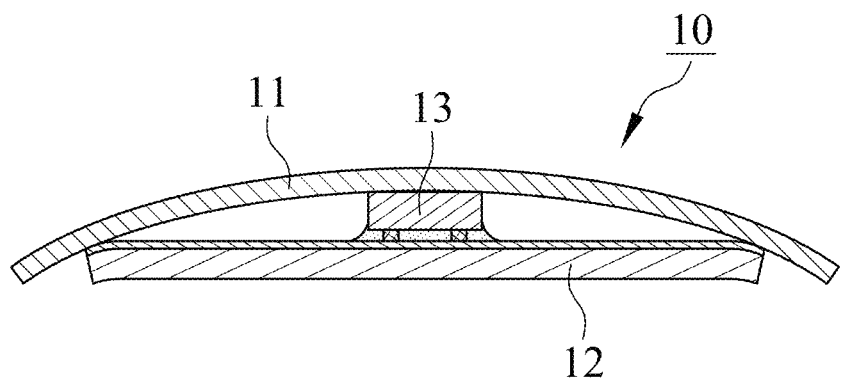
FIG. 5 is a cross-section view diagram illustrating a conventional chip package and a curved panel.

With reference to FIGS. 1 and 2, the flexible substrate 110 includes a first surface 111 and a second surface 112, and the chip 120 is disposed on the first surface 111 of the flexible substrate 110. The chip 120 includes an active surface 121 and a back surface 122, and the active surface 121 faces toward the first surface 111 and is electrically connected with the flexible substrate 110. With reference to FIGS. 3 and 4, a plurality of bump 120a of the chip 120 are electrically connected to a plurality of conductive pads 110a of the flexible substrate 110 in this embodiment. And preferably, the chip package 100 further includes an underfill 170 which is filled between the chip 120 and the flexible substrate 110 for encapsulating the bump 120a and the conductive pad 110a. With reference to FIGS. 3 and 4, a first height H1 exists between the back surface 122 of the chip 120 and the first surface 111 of the flexible substrate 110.

With reference to FIGS. 1 and 2, the reinforcement sheet 130 is connected to the second surface 112 of the flexible substrate 110. With reference to FIGS. 3 and 4, the reinforcement sheet 130 in this embodiment is connected to the second surface 112 of the flexible substrate 110 by an adhesive 150. A reinforcement region 130A on the first surface 111 of the flexible substrate 110 is defined by a profile of the reinforcement sheet 130, and the chip 120 is located within the reinforcement region 130A. Preferably, the reinforcement sheet 130 has a rigidity greater than that of the flexible substrate 110 such that can prevent the flexible substrate 110 located within the reinforcement region 130A from bending and deforming. The reinforcement sheet 130 can be made of a metal material for cooling the chip package 100.

With reference to FIGS. 1 and 2, the pressure-proof member 140 is disposed on the first surface 111 of the flexible substrate 110 and at least includes a pair of pressure-proof ribs 141 which are located outside of the chip 120 oppositely. And preferably, the pressure-proof ribs 141 are located outsides the chip 120 symmetrically. With reference to FIGS. 3 and 4, in this embodiment, the pressure-proof member 140 is connected to the first surface 111 of the flexible substrate 110 by an adhesive 160. The pressure-proof member 140 is preferably made of polyimide (PT), polyethylene terephthalate (PET) or stainless steel (SUS).

With reference to FIGS. 1 and 2, the pressure-proof ribs 141 are connected with each other in this embodiment, and the pressure-proof member 140 is circular around the chip 120.

With reference to FIGS. 1 to 4, each of the pressure-proof ribs 141 includes a revealed surface 141a and a connective surface 141b opposite the revealed surface 141a, and the connective surface 141b faces toward the first surface 111 of the flexible substrate 110. In this embodiment, the connective surface 141b is connected to the first surface 111 of the flexible substrate 110 by the adhesive 160. A second height H2 exists between the revealed surface 141a of the pressure-proof rib 141 and the first surface 111 of the flexible substrate 110, and the second height H2 is higher than or equal to the first height H1. Preferably, the second height H2 is higher than the first height H1, and the pressure-proof member 140 is located within the reinforcement region 130A.

With reference to FIGS. 1, 3 and 4, when the chip package 100 is mounted in an electronic product (e.g. liquid crystal display) having a curved panel 200 and is pressed by the curved panel 200 whose curvature is too large, the curved panel 200 will press on the pressure-proof ribs 141, not press on the chip 200 located between the pressure-proof ribs 141 owing to the second height H2 between the revealed surface 141a of the pressure-proof ribs 141 and the first surface 111 of the flexible substrate 110 is not lower than the first height H1 between the back surface 122 of the chip 120 and the first surface 111 of the flexible substrate 110. As a result, the chip 120 can be protect from the damage caused by the pressure of the curved panel 200.

With reference to FIGS. 1, 3 and 4, the pressure-proof member 140 located within the reinforcement region 130A can improve the pressure and bending resistances of the chip package 100. And owing to the pressure-proof member 140 will not be deformed by the pressure of the curved panel 200, the chip 120 will not be pressed by the curved panel.

While this invention has been particularly illustrated and described in detail with respect to the preferred embodiments thereof, it will be clearly understood by those skilled in the art that is not limited to the specific features shown and described and various modified and changed in form and details may be made without departing from the spirit and scope of this invention.

What is claimed is:

1. A chip package, comprising:
   a flexible substrate including a first surface and a second surface;
   a chip disposed on the first surface of the flexible substrate, the chip includes an active surface and a back surface, the active surface faces toward the first surface and is electrically connected to the flexible substrate, and a first height exists between the back surface of the chip and the first surface of the flexible substrate;
   a reinforcement sheet connected to the second surface of the flexible substrate, a reinforcement region on the first surface of the flexible substrate is defined by a profile of the reinforcement sheet, and the chip is located within the reinforcement region; and
   a preformed pressure-proof member disposed on the first surface of the flexible substrate including at least a pair of preformed pressure-proof ribs which are located outside of the chip oppositely and wholly within the reinforcement region, each of the preformed pressure-proof ribs includes a revealed surface and a connective surface opposite the revealed surface, the connective surface faces toward the first surface of the flexible substrate, and a second height exists between the revealed surface of the preformed pressure-proof rib and the first surface of the flexible substrate, wherein the second height is higher than the first height.

2. The chip package in accordance with claim 1, wherein the preformed pressure-proof member encircles the chip.

3. The chip package in accordance with claim 1, wherein the preformed pressure-proof ribs are located outside the chip symmetrically.

4. The chip package in accordance with claim 1, wherein the reinforcement sheet has rigidity greater than that of the flexible substrate.

5. The chip package in accordance with claim 1, wherein the preformed pressure-proof member is made of polyimide (PI), polyethylene terephthalate (PET) or stainless steel (SUS).

6. The chip package in accordance with claim 1, wherein the reinforcement sheet is connected to the second surface of the flexible substrate by an adhesive.

7. The chip package in accordance with claim 1, wherein the connective surface of each preformed pressure-proof rib is connected to the first surface of the flexible substrate by an adhesive.

* * * * *